United States Patent [19]

Kimura et al.

[11] Patent Number: 4,996,580
[45] Date of Patent: Feb. 26, 1991

[54] BIPOLAR SEMICONDUCTOR DEVICE

[75] Inventors: Takashi Kimura, Yokohama; Mie Kato, Kawasaki, both of Japan

[73] Assignee: Kabushiki Kaisha Toshiba, Kawasaki, Japan

[21] Appl. No.: 256,662

[22] Filed: Oct. 13, 1988

[30] Foreign Application Priority Data

Oct. 14, 1987 [JP] Japan .................. 62-258661

[51] Int. Cl.$^5$ ........................... H01L 27/04
[52] U.S. Cl. ..................... 357/34; 357/13; 357/36; 357/46; 357/59
[58] Field of Search ............ 357/34, 65, 68, 59, 357/36, 13, 46; 437/8

[56] References Cited

U.S. PATENT DOCUMENTS

| | | | |
|---|---|---|---|
| 4,213,806 | 7/1980 | Tsang | 357/13 |
| 4,283,733 | 8/1981 | Aomura | 357/36 |
| 4,319,257 | 3/1982 | Beasom | 357/35 |
| 4,435,225 | 3/1984 | Shideler | 148/1.5 |

FOREIGN PATENT DOCUMENTS 61-181140 8/1986 Japan .
62-193137 8/1987 Japan ................. 437/8

OTHER PUBLICATIONS

Muller & Kamins, "Device Electronics . . . ", (1986), p. 96.
L. Glasser & D. Dubberpuhl, "The Design & Analysis of VLSI Circuits", Addison–Wesley Pub. Co., Reading, Mass., p. 185, 1985.

Primary Examiner—William D. Larkins
Attorney, Agent, or Firm—Finnegan, Henderson, Farabow, Garrett, and Dunner

[57] ABSTRACT

A test structure for measuring bipolar transistor gain has a base contacting region (16) doped the same conductivity type as the emitter region (13). The base contacting region (16) is located within a region (15) overlapping with and more heavily doped than the transistor base (12). Polysilicon contacts 21, 22 are provided respectively to the transistor emitter 13 and to the base contacting region 16.

3 Claims, 5 Drawing Sheets

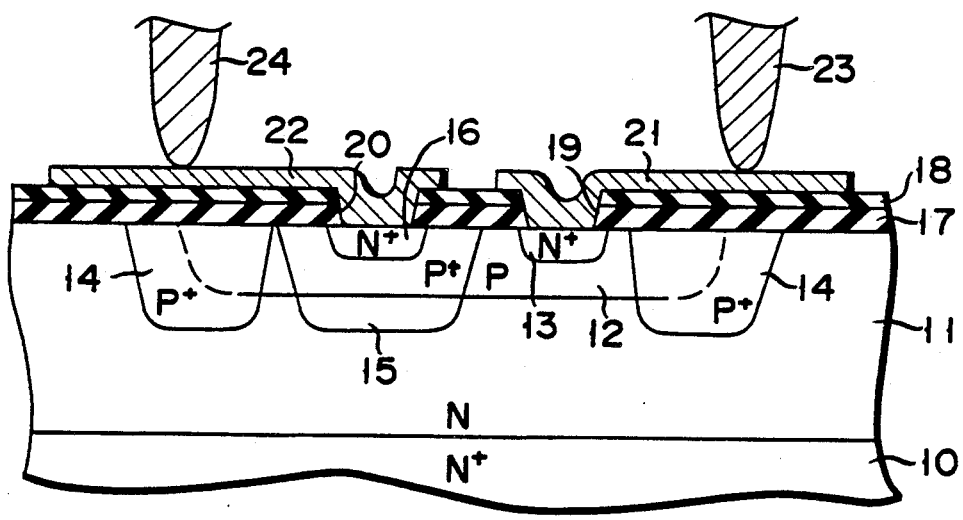
F I G. 3

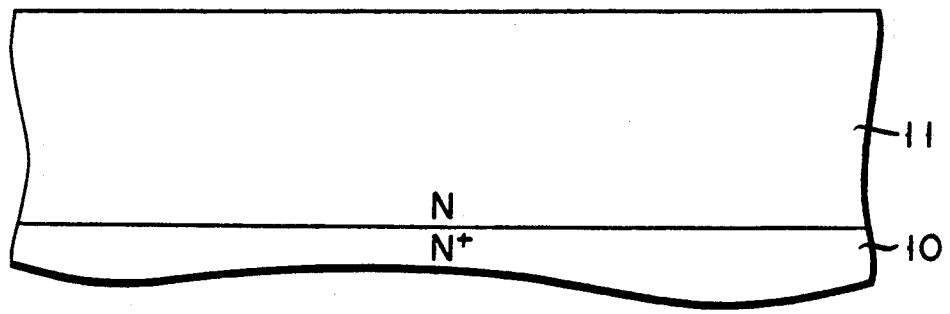
F I G. 4A
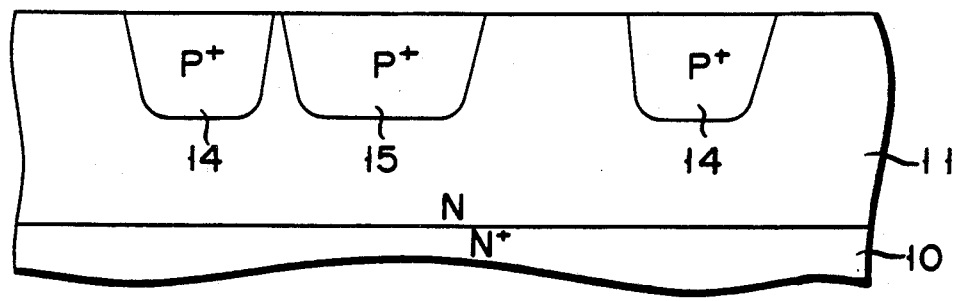
F I G. 4B
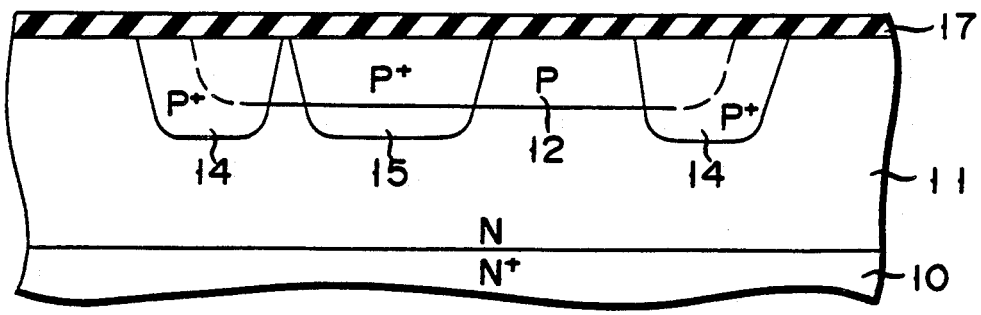
F I G. 4C

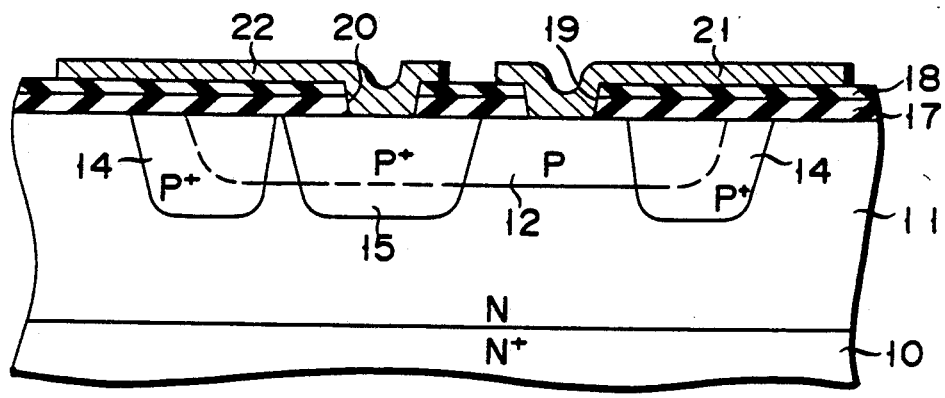
F I G. 4G
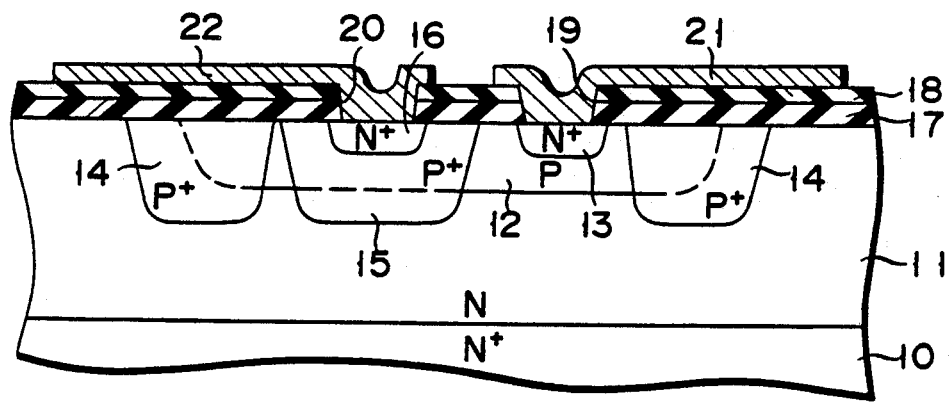
F I G. 4H
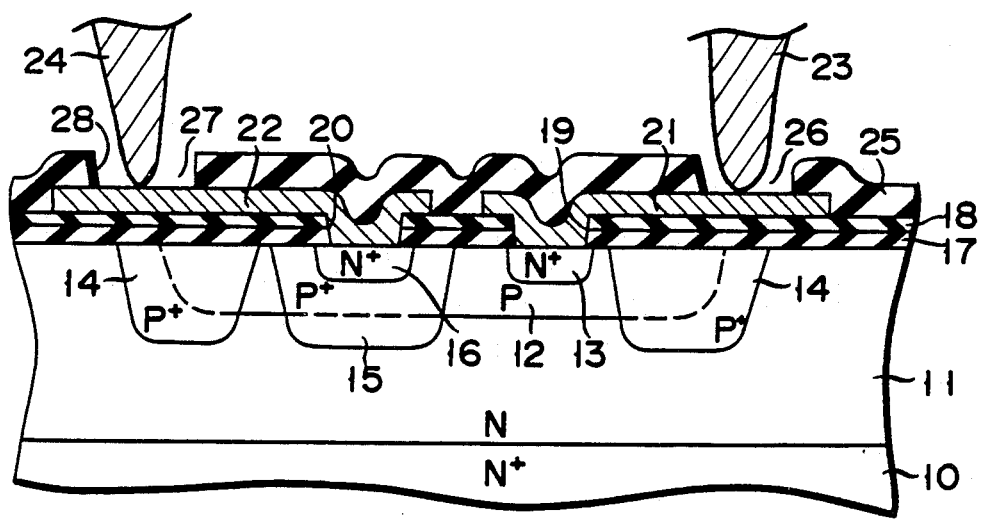
F I G. 5

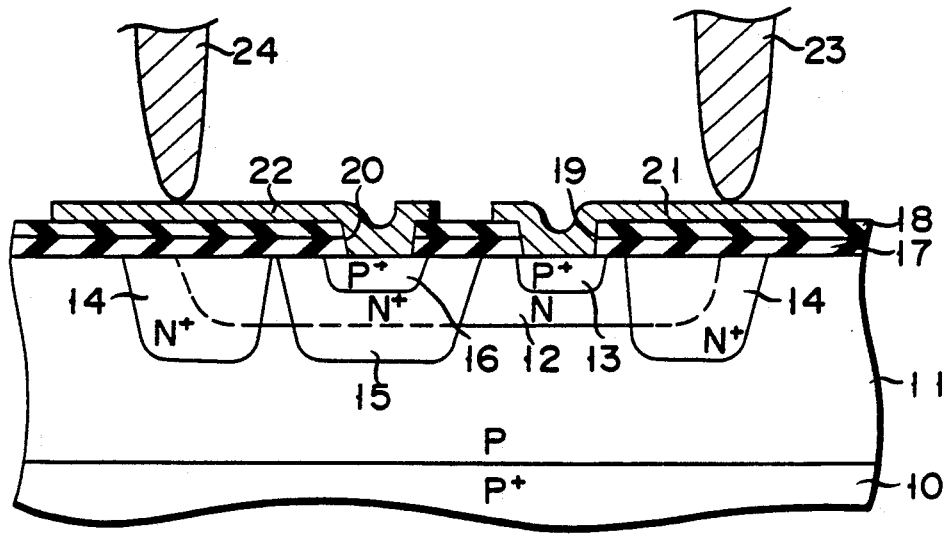
F I G. 6
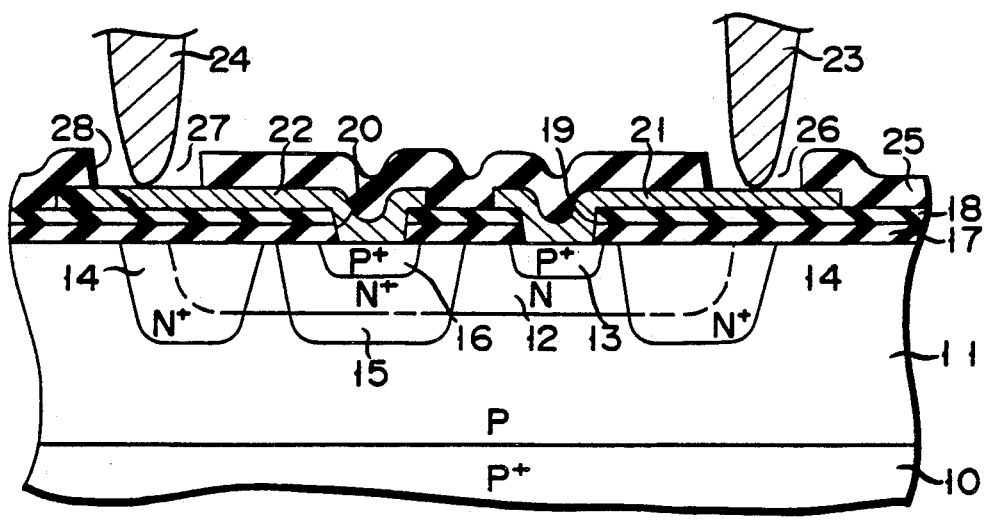
F I G. 7

BIPOLAR SEMICONDUCTOR DEVICE

Background of the Invention

1. Field of the Invention

The present invention relates to a bipolar semiconductor device and, more particularly, to a semiconductor device having a structure for monitoring current amplification of a transistor formed in the device.

2. Description of the Related Art

In a bipolar transistor, current amplification hFE of the transistor is one of the important factors which determines the performance of the transistor.

FIG. 1 is a sectional view showing an element structure of a conventional npn transistor. Epitaxially grown n-type collector region 31 is formed on n+-type silicon semiconductor substrate 30, p-type base region 32 is formed in a surface layer of collector region 31 by impurity diffusion, n+-type emitter region 33 is formed, also by impurity diffusion, in a surface layer of base region 32, and p+-type base contact region 34 is formed in contact with base region 32, again by impurity diffusion. Finally, insulating film 35 having a predetermined pattern is formed on the substrate surface as a protective film.

The hFE of the above transistor is measured as a ratio of the collector current to the base current, the collector current being measured when the base current flows upon application of a predetermined bias voltage to the collector-emitter path. If the result of measurement of the hFE indicates that it is not at a desired value, emitter region 33 is then subjected to additional impurity diffusion, after which the hFE is measured once again.

When the hFE of the transistor is to be measured, as shown in FIG. 1, leads 36 and 37 connected to predetermined potentials are respectively brought into contact with the surfaces of n+-type emitter region 33 and p+-type base contact region 34 to flow a base current through base region 32 to operate the transistor. A portion of insulating film 35 (a portion indicated by a broken line) is removed to form a contact hole in film 35 so that lead 37 can be brought into contact with region 34 via the contact hole. However, the base-emitter junction is directly exposed to the atmosphere via the contact hole. Thus, it is difficult to accurately measured the hFE. For this reason, the hFE cannot be set at a desired value.

In order to eliminate the above shortcoming, a conventional npn transistor having an hFE monitor structure has been developed, and is shown in FIG. 2. Two n+-type emitter regions, 33A and 33B, are formed in p-type base region 32 of this transistor, region 33A serving as a normal emitter region, and region 33B as a dummy base region. A p-n junction between emitter region 33A and p-type base region 32 is covered by insulating film 35. When the hFE of the transistor is to be measured, leads 36 and 37 are brought into contact with the surfaces of regions 33A and 33B, respectively, to apply a reverse bias voltage across a path between dummy base region 33B and p-type base region 32 so that a base current flows through p-type base region 32 to operate the transistor.

In this transistor having a monitor structure, the base-emitter junction is not exposed to the atmosphere. However, in order for the base current to flow in the above structure, a large reverse bias voltage is applied to the path between dummy base region 33B and p-type base region 32. Thus, in a high-frequency transistor in which diffusion depth xj of p-type base region 32 is very small (normally 1 μm or less), the hFE measured using the dummy base is greatly different from the hFE of the normal transistor (transistor having p-type region 32 as a base region). As a result, the hFE of the normal transistor cannot be set at a desired value.

SUMMARY OF THE INVENTION

The present invention has been developed in consideration of the above situation, and has as its object to provide a semiconductor device having a monitor structure for accurately measuring the hFE of a normal semiconductor element, and which is capable of setting the hFE of a normal semiconductor element at a desired value.

The semiconductor device according to the present invention comprises a semiconductor body of a first conductivity type; a first semiconductor region of a second conductivity type, formed in the semiconductor body; a second semiconductor region of the first conductivity type, formed in the first semiconductor region; a third semiconductor region of the second conductivity type, formed in the first semiconductor region and containing an impurity having a concentration higher than that of the first semiconductor region; a fourth semiconductor region of the first conductivity type, formed in the third semiconductor region; insulating films formed on the semiconductor body and having first and second openings at positions respectively corresponding to the second and fourth semiconductor regions, a first polysilicon semiconductor layer, connected to the second semiconductor region through the first opening of the insulating films and containing an impurity of the first conductivity type; and a second polysilicon semiconductor layer, connected to the fourth semiconductor region through the second opening of the insulating films and containing an impurity of the first conductivity type.

In the above-described semiconductor device of the present invention, a fourth semiconductor region, which is used as a dummy base, is formed in the third semiconductor region of the same conductivity type as the first semiconductor region serving as a base region and containing an impurity having a concentration higher than that of the first semiconductor region. A relatively small reverse bias applied to a p-n junction formed between the fourth and third semiconductor regions suffices to flow the base current, with the result that the hFE of the normal transistor can be measured with a high precision.

BRIEF DESCRIPTION OF THE DRAWINGS

FIG. 3 is a sectional view of an npn transistor according to an embodiment of the present invention;

FIGS. 4A to 4H are sectional views showing the structure of the npn transistor of FIG. 3, in each manufacturing step;

FIG. 5 is a sectional view of the npn transistor according to another embodiment of the present invention; and FIGS. 6 and 7 are sectional views of npn transistors according to further embodiments of the present invention.

DETAILED DESCRIPTION OF THE PREFERRED EMBODIMENTS

Figure 1:
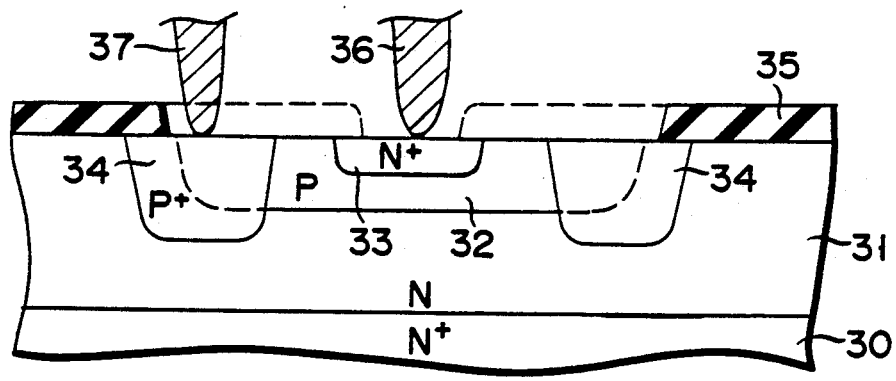
FIG. 1 is a sectional view of a conventional npn transistor.

The present invention will now be described below, with reference to the accompanying drawings.

FIG. 3 is a sectional view showing the element structure of an npn transistor of a semiconductor device according to a first embodiment of the present invention. Referring to FIG. 3, reference numeral 10 denotes an n+-type silicon semiconductor substrate on which is formed n-type collector region layer 11 having a thickness of 10 μm. P-type base region 12 having a depth of 0.3 μm is formed in a surface layer of n-type collector region layer 11, and n+-type emitter region 13 is formed in a surface layer of base region 12. In addition, p+-type base contact region 14 is formed in contact with base region 12, p+-type high-concentration region 15 is formed in p-type base region 12, and n+-type high-concentration region 16, which serves as a dummy base region, is formed in a surface layer of p+-type high-concentration region 15.

Silicon oxide film (SiO$_2$) 17 is formed on the surface of n-type collector region layer 11, and silicon nitride film (Si$_3$N$_4$) 18 is formed thereon. Openings 19 and 20 are formed in films 17 and 18, and partially expose the surfaces of n+-type emitter region 13 and n+-type high-concentration region 16, respectively. Polysilicon layer 21 is formed on silicon nitride film 18, such that it contacts the surface of n+-type emitter region 13 through opening 19, and polysilicon layer 22 is also formed on film 18, such that it contacts the surface of n+-type high-concentration region 16 through opening 20. To form the above polysilicon layers 21 and 22, polysilicon containing an n-type impurity is deposited on the major surface of the semiconductor device and, then, the formed polysilicon layer is patterned to form layers 21 and 22. Polysilicon layer 21 is used as an emitter electrode, and polysilicon layer 22 as a dummy base electrode.

Current amplification hFE of the transistor is measured as a ratio of the collector current to the base current, the collector current being measured when the base current flows through leads 23 and 34 connected to predetermined potentials upon application of a predetermined bias voltage to a collector-emitter path. When the hFE is to be measured, as shown in FIG. 3, leads 23 and 24 are brought into contact with the surfaces of polysilicon layers 21 and 22 to apply predetermined potentials to regions 23 and 24 so that the base current flows through base region 12.

Figure 2:
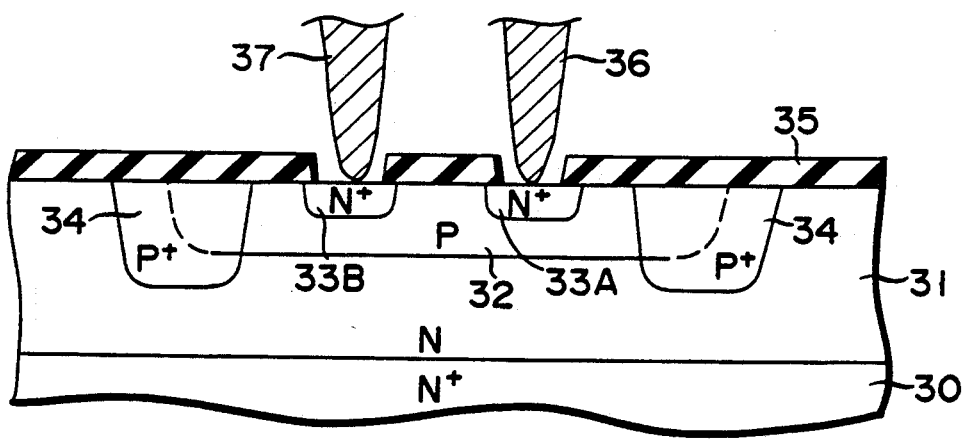
FIG. 2 is a sectional view of the conventional npn transistor having an hFE monitor structure.

A p-n junction is formed between n+-type emitter region 13 and p-type base region 12, and covered by polysilicon layer 21 and thus not directly exposed to the atmosphere. Therefore, the hFE is not influenced by the atmosphere. In addition, since n+-type highconcentration region 16, which serves as a dummy base region of this embodiment, is formed in p+-type highconcentration region 15 containing an impurity having a concentration higher than that of p-type base region 12, the value of a reverse bias voltage to be applied to the p-n junction formed between n+-type high-concentration region 16 and p+-type high-concentration region 15, when a base current flows, can be smaller than that in the conventional device shown in FIG. 2. Therefore, a reverse breakdown voltage of the p-n junction can be small. As a result, the hFE using the dummy base become approximate to the hFE of a normal transistor (transistor having p-type region 12 as a base region).

Thus, even in a high-frequency transistor in which the diffusion depth of p-type base region 12 is very small, the hFE measured using the dummy base has substantially same value as that of the normal transistor. Therefore, according to the transistor structure in the above embodiment, the hFE value of the normal transistor can be set at a desired value.

The transistor having the above structure can be manufactured by the following method: 10-μm thick n-type collector region layer 11 containing P (phosphorus) having a concentration of $1 \times 10^{15}$ atoms/cm$^3$ is formed on a silicon substrate 10 containing Sb (stibium) having a concentration of $1 \times 10^{18}$ atoms/cm$^3$ (FIG. 4A). Then, a photo resist mask (not shown) having a predetermined pattern is formed on the surface of collector region layer 11. Next, B (boron) ions are implanted through the photo resist mask at an acceleration voltage of 40 keV and a dose of $2 \times 10^{15}$ ions/cm$^2$, and are diffused and activated by annealing which is performed at 1,000° C. for one hour, to form p+-typ contact region 14 and p+-type high-concentration region 15 (FIG. 4B).

Figure 4D:
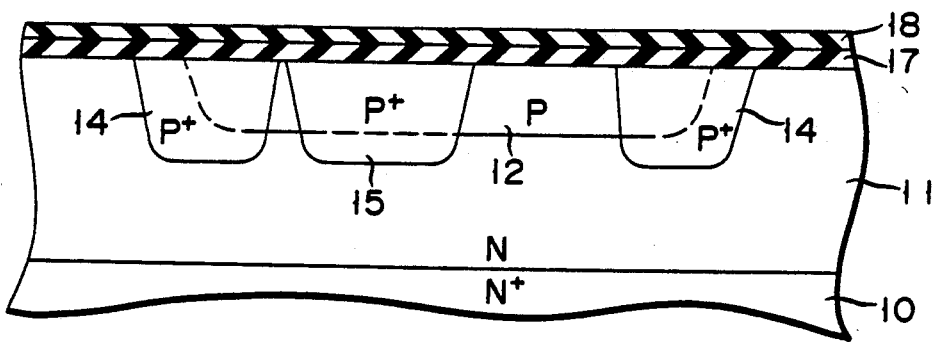
Figure 4E:
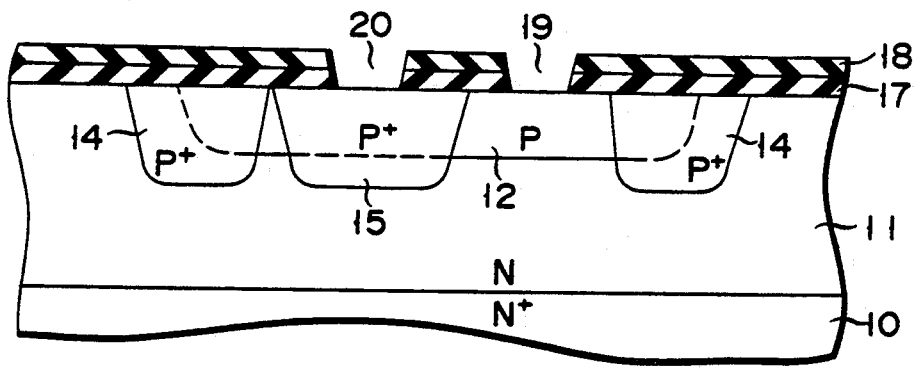
Figure 4F:
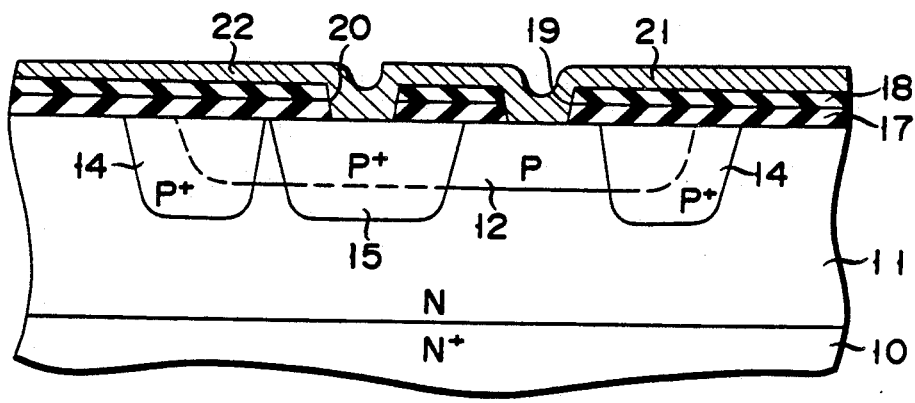

Subsequently, silicon oxide film 17 having a thickness of 1,500Å is grown on the surface of n-type collector region layer 11 by thermal oxidation, and a photo resist mask (not shown) is formed thereon. Then, B ions are implanted at an acceleration voltage of 35 keV and a dose of $1 \times 10^{14}$ ions/cm$^2$ to form p-type base region 12 having a depth of 0.3 μm by annealing at 900° C. for 30 minutes (FIG. 4C). Thereafter, silicon nitride film 18 is formed on silicon oxide film 17 by thermal decomposition (FIG. 4D). Openings 19 and 20 are formed by photolithography (FIG. 4E). Heating is performed in a gas mixture containing SiH$_4$ and AsH$_3$ to 700° C. to form a 5,000-Å thick polysilicon layer containing As (arsenic) on silicon nitride film 18 (FIG. 4F). Thereafter, unnecessary portions of the polysilicon layer are removed by selective etching and therefore patterning is performed to form polysilicon layers 21 and 22 (FIG. 4G). Then, in order to prevent out-diffusion of the impurity contained in these polysilicon layers 21 and 22, a silicon oxide film (not shown) having a thickness of 5,000Å is formed on the entire surface by thermal decomposition. Subsequently, annealing is performed at 1,000° C. for 20 sec to diffuse the impurity into collector region layer 11 from polysilicon layers 21 and 22. Then, n+-type emitter region 13 and n+-type high-concentration region 16 are formed in p-type base region 12 and p+-type high-concentration region 15, respectively (FIG. 4H). As described above, the transistor having the structure shown in FIG. 3 is formed.

When the hFE is measured, the silicon oxide film for preventing the out-diffusion is removed to expose the surfaces of polysilicon layers 21 and 22. In this state, leads 23 and 24 are brought into contact with the surfaces of the respective layers, and a low reverse bias voltage is applied to the p-n junction between n+-type region 16 and p+-type region 15 through these leads 23 and 24, thus flowing a base current of, e.g., about 5 to 50 μA.

When the hFE does not reach a desired value, polysilicon layers 21 and 22 are covered again with the silicon oxide film, and annealing is performed again, thereby diffusing the impurity to collector region layer 11 from polysilicon layers 21 and 22. These steps are repeated a required number of times, so that the hFE can be set at the desired value.

FIG. 5 is a sectional view showing an element structure of a semiconductor device according to a second embodiment of the present invention. The device in this embodiment differs from that in the above embodiment in that silicon oxide film 25 is formed on polysilicon layers 21 and 22. Openings 26 and 27 are formed at positions of silicon oxide film 25 in which the above leads 23 and 24 are respectively brought into contact with polysilicon layers 21 and 22.

In the device having the above structure, since silicon oxide film 25 is formed on the surfaces of polysilicon layers 21 and 22, the reheating process after the measurement of the hFE can be performed without forming another silicon oxide film on polysilicon layers 21 and 22, thus effectively improving the workability.

In the devices of the above embodiments as described above, the hFE of a normal transistor can be measured with high precision, and the hFE can be set at a desired value. Furthermore, in the devices of the above embodiments, since sheet resistances of polysilicon layers 21 and 22 are sufficiently decreased to 10 $\Omega/\square$ or less, this transistor can be used as not only a transistor having an hFE monitor structure but also as a multi-layered electrode element.

Note that the present invention is not limited to the above embodiments and various changes and modifications can be made. For example, in the embodiments in FIGS. 3 and 4, the case where the present invention is applied to an npn transistor is described. However, as shown in FIGS. 6 and 7, a p-type semiconductor is used as substrate 10 and a p-type epitaxial layer is grown thereon, so that a pnp transistor can be arranged.

According to the present invention as described above, there is provided to a semiconductor device in which the hFE of a normal semiconductor element can be measured with high precision, and can be set at a desired hFE value.

What is claimed is:

1. A semiconductor device comprising:
   a semiconductor body of a first conductivity type;
   a first semiconductor region of a second conductivity type, formed in said semiconductor body;
   a second semiconductor region of the first conductivity type, formed in a surface region of said first semiconductor region;
   a third semiconductor region of the second conductivity type, formed in said first semiconductor region and containing an impurity having a concentration higher than that of said first semiconductor region;
   a fourth semiconductor region of the first conductivity type, formed in said third semiconductor region;
   an insulating film formed on said semiconductor body and having first and second openings at positions respectively corresponding to said second and fourth semiconductor regions;
   a first polysilicon semiconductor layer connected to said second semiconductor region through said first opening of said insulating films and containing an impurity of the first conductivity type; and
   a second polysilicon semiconductor layer connected to said fourth semiconductor region through said second opening of said insulating films and containing an impurity of the first conductivity type.

2. A device according to claim 1, wherein said semiconductor body, said first semiconductor region, said second semiconductor region, said fourth semiconductor region, said first polysilicon semiconductor layer, and said second polysilicon semiconductor layer are used as a collector, a base region, an emitter region, a base contact region, an emitter electrode, and a base electrode, respectively.

3. A device according to claim 1, further comprising a second insulating film formed on said first and second polysilicon semiconductor layers, and having openings for partially exposing said polysilicon semiconductor layers.

* * * * *